US012000037B2

(12) United States Patent
Maschmann et al.

(10) Patent No.: US 12,000,037 B2
(45) Date of Patent: *Jun. 4, 2024

(54) AREA SELECTIVE NANOSCALE-THIN LAYER DEPOSITION VIA PRECISE FUNCTIONAL GROUP LITHOGRAPHY

(71) Applicant: The Curators of the University of Missouri, Columbia, MO (US)

(72) Inventors: Matthew R. Maschmann, Columbia, MO (US); Matthias J. Young, Columbia, MO (US)

(73) Assignee: The Curators of the University of Missouri, Columbia, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/146,043

(22) Filed: Dec. 23, 2022

(65) Prior Publication Data

US 2023/0132011 A1    Apr. 27, 2023

Related U.S. Application Data

(63) Continuation of application No. 17/387,185, filed on Jul. 28, 2021.

(60) Provisional application No. 63/058,103, filed on Jul. 29, 2020.

(51) Int. Cl.
| C23C 16/02 | (2006.01) |
| C23C 16/20 | (2006.01) |
| C23C 16/40 | (2006.01) |
| C23C 16/455 | (2006.01) |

(52) U.S. Cl.
CPC .......... *C23C 16/0263* (2013.01); *C23C 16/20* (2013.01); *C23C 16/403* (2013.01); *C23C 16/45527* (2013.01)

(58) Field of Classification Search
CPC ... C23C 16/0263; C23C 16/20; C23C 16/403; C23C 16/45527
See application file for complete search history.

(56) References Cited

U.S. PATENT DOCUMENTS

| 3,732,013 | A | 5/1973 | Hieslmair et al. |
| 5,604,153 | A | 2/1997 | Tsubouchi et al. |
| 6,582,823 | B1 | 6/2003 | Sakhrani et al. |
| 6,664,044 | B1 | 12/2003 | Sato |
| 8,483,793 | B2 * | 7/2013 | Simpson ............ A61B 5/14532 600/347 |
| 8,531,029 | B2 | 9/2013 | Fedorov et al. |
| 8,920,491 | B2 | 12/2014 | Flanagan et al. |
| 9,393,217 | B2 | 7/2016 | Hammond et al. |
| 9,671,409 | B2 * | 6/2017 | Cheng ................. C23C 18/1212 |
| 10,278,927 | B2 | 5/2019 | Hammond et al. |
| 10,538,844 | B2 | 1/2020 | Bishop |
| 11,613,807 | B2 * | 3/2023 | Maschmann ......... C23C 16/047 427/552 |
| 2004/0027700 | A1 | 2/2004 | Yoshida |
| 2004/0185260 | A1 | 9/2004 | Luzinov et al. |
| 2004/0248381 | A1 | 12/2004 | Myrick |
| 2005/0214476 | A1 | 9/2005 | Goodwin |
| 2009/0081461 | A1 | 3/2009 | Yi et al. |
| 2009/0137043 | A1 | 5/2009 | Parsons et al. |
| 2009/0202739 | A1 | 8/2009 | O'Neill et al. |
| 2009/0291270 | A1 | 11/2009 | Zettl et al. |
| 2009/0302426 | A1 * | 12/2009 | McLaughlin ......... F01P 3/2285 257/E21.352 |
| 2010/0098877 | A1 * | 4/2010 | Cooper .................... B01J 20/20 977/890 |
| 2014/0322452 | A1 | 10/2014 | Kasyanova et al. |
| 2014/0340818 | A1 | 11/2014 | Ming et al. |
| 2015/0045498 | A1 | 2/2015 | Badyal et al. |
| 2015/0086799 | A1 | 3/2015 | Kasyanova et al. |
| 2015/0114821 | A1 | 4/2015 | Huang et al. |
| 2018/0297387 | A1 | 10/2018 | Miller et al. |
| 2021/0094831 | A1 | 4/2021 | Barsoum et al. |

FOREIGN PATENT DOCUMENTS

| KR | 20080092983 | * 10/2008 | ............... B82B 1/00 |
| WO | 2009/132165 A2 | 10/2009 | |
| WO | 2012/099635 A2 | 7/2012 | |
| WO | 2015/154724 A1 | 10/2015 | |
| WO | WO 2017/100625 A2 * | 6/2017 | ............. A61L 31/14 |

OTHER PUBLICATIONS

Patwardhan, Sameer, et al., "Atomic Layer Deposition Nucleation on Isolated Self-Assembled Monolayer Functional Groups: A Combined DFT and Experimental Study". ACS Appl. Energy Mater. 2019, 2, 4618-4628.*
Masuda, Y., et al., "Templated Site-Selective Deposition of Titanium Dioxide on Self-Assembled Monolayers". Chemistry of Materials, vol. 14, Issue 3, 2002, pp. 1236-1241.*
Parsons, Gregory N., et al., "Area-Selective Deposition: Fundamentals, Applications, and Future Outlook". Chemistry of Materials, vol. 32, Issue 12, pp. 4920-4953.*
Ishida, Masaya, et al., "Selective Deposition of Electroless Plating Films Using the Difference between the Functional Groups of Self-Assembled Monolayers". Jpn. J. Appl. Phys., vol. 39 (2000) pp. L227-L229.*
Kim, Woo-Hee, et al., "A Process for Topographically Selective Deposition on 3D Nanostructures by Ion Implanatation". ACS Nano, 2016, 10, 4451-4458.*
Fang, Ming, et al., "Area-Selective Atomic Layer Deposition: Conformal Coating, Subnanometer Thickness Control, and Smart Positioning". ACS Nano, 2015, vol. 9 No.9, 8651-8654.*
Seemann, Livia, et al., "Selective deposition of functionalized nano-objects by nanoxerography". Microelectronic Engineering 84 (2007) 1423-1426.*

(Continued)

*Primary Examiner* — Bret P Chen
(74) *Attorney, Agent, or Firm* — Stinson LLP

(57) ABSTRACT

A method of depositing a nanoscale-thin film onto a substrate is disclosed. The method generally comprises depositing a layer of a solid or gaseous state functionalizing molecule onto or adjacent to the first surface of the substrate and exposing the first surface to a source of ionizing radiation, thereby functionalizing the first surface of the substrate. Once the layer of functionalizing molecule is removed, a nanoscale-thin film is then deposited onto the functionalized first surface of the substrate.

19 Claims, 9 Drawing Sheets

(56) References Cited

OTHER PUBLICATIONS

Alles, et al., "Atomic Layer Deposition of High-k Oxides on Graphene", Chapter 7 from Graphene-Synthesis, Characterization, Properties and Applications, INTECH, 2011 (18 pgs).

Basta, et al., "Substrate Surface Effects on Electron-Irradiated Graphene", preprint submitted to Journal of LATEX Templates, Mar. 30, 2021 (22 pgs).

Boyle, et al., PowerPoint Poster, "Electron Beam Induced Functionalization of Graphene for Atomic Layer Deposition", 2020 (1 pg).

Article, "Oxygen Adsorption in Graphene can be Controlled Using a Field-Effect Transistor", Graphene-Info, Aug. 24, 2021 (2 pgs).

Vervuurt, et al., "Atomic Layer Deposition for Graphene Device Integration", Adv. Mater. Interfaces, vol. 4, 2017, No. 1700232 (19 pgs).

Elsukova, et al., "Effect of Molecular Weight on the Feature Size in Organic Ice Resists", Nano Lett. 2018, 18, 7576-7582 (7 pgs).

Han, et al., "Ice Lithography for Nanodevices", Nano Lett. 2010, 10, 5056-5059 (4 pgs).

Islam, et al., "Defect Engineering of Graphene Using Electron-Beam Chemistry with Radiolyzed Water", Carbon 155 (2020) 446-455 (10 pgs).

Kim, et al., "Realization of a high mobility dual-gated graphene field effect transistor with Al2O3 dielectric", Appl. Phys. Lett. 94, 062107 (2009) (4 pgs).

Kim, et al., "Dynamic modulation of electronic properties of graphene by localized carbon doping using focused electron beam induced deposition", Nanoscale, 2015, 7, 14946 (7 pgs).

King, et al., "Nanometer Patterning with Ice", Nano Letters, vol. 5, No. 6 (2005) 1157-1160 (4 pgs).

Hong, et al., "Micropatterning of graphene sheets: recent advances in techniques and applications", J. Mater. Chem, 2012, 22, 8179 (13 pgs).

Carpenz-Nunez, et al., "Water-assisted, electron-beam induced activation of carbon nanotube catalyst supports for mask-less, resist-free patterning", Carbon 135 (2018) 270-277 (8 pgs).

Shen, et al., "How do the electron beam writing and metal deposition affect the properties of graphene during device fabrication?", Nanoscale, 2013, 5, 3352 (7 pgs).

Ye, et al., "Atomic Layer Deposition of High-Quality HFO2 Film on Graphene Using Low Energy Electron Beam Pretreatment", ICSICT2014, Guilin, China, IEEE Xplore, 2014 (3 pgs).

Biener, M.M. et al., "ALD Functionalized Nanoporous Gold: Thermal Stability, Mechanical Properties, and Catalytic Activity" Nanoletters, Mar. 24, 2011, LLNL-JRNL-475802, pp. 1-14.

Lin, Zhengjie et al., "A functionalized TiO2/Mg2TiO4 nano-layer on biodegradable magnesium implant enables superior bone-implant integration and bacterial disinfection" Biomaterials 219 (2019) 119372, pp. 1-19.

Alaboina, Pankaj et al., "In Situ Dendrite Suppression Study of Nanolayer Encapsulated Li Metal Enabled by Zirconia Atomic Layer Deposition" ACS Appl. Mater. Interfaces 2018, 10, 32801-32808.

Cao, Kun et al., "Surface functionalization on nanoparticles via atomic layer deposition" Science Bulletin 65(8) Apr. 2020, 1 page (Abstract only).

Zhou, Han et al., "Molecular Layer Deposition of Functional Thin Films for Advanced Lithographic Patterning" Applied Materials & Interfaces, 2011, 3, 505-511.

Mathur, S. et al., "Functional Metal Oxide Coatings by Molecule-Based Thermal and Plasma Chemical Vapor Deposition Techniques" Journal of Nanoscience and Nanotechnology, vol. 8, 2597-2603, 2008.

Hu, Liang et al., "Coating strategies for atomic layer deposition" Nanotechnology Review 2017, 6(6) 527-547.

Mackus, Adriaan J.M. et al., "From the Bottom-Up: Toward Area-Selective Atomic Layer Deposition with High Selectivity" Chemistry of Materials, 2019, 31, 2-12.

Balasubramanyam, Shashank et al., "Area-Selective Atomic Layer Deposition of Two-Dimensional WS2 Nanolayers" ACS Materials Letters, 2020, 2, 511-518.

* cited by examiner

AREA SELECTIVE NANOSCALE-THIN LAYER DEPOSITION VIA PRECISE FUNCTIONAL GROUP LITHOGRAPHY

CROSS-REFERENCE TO RELATED APPLICATIONS

This application claims priority to U.S. application Ser. No. 17/387,185, filed Jul. 28, 2021 and issued as U.S. Pat. No. 11,613,807 on Mar. 28, 2023, which claims priority to U.S. Provisional Application No. 63/058,103, filed Jul. 29, 2020.

STATEMENT REGARDING FEDERALLY SPONSORED RESEARCH OR DEVELOPMENT

This invention was made with Government support under Contract 1757936 awarded by the National Science Foundation. The Government has certain rights in the invention.

FIELD OF THE DISCLOSURE

The present disclosure relates to methods of functionalizing a substrate using solid or gaseous functionalizing molecules and depositing a nanoscale-thin film onto the substrate.

BACKGROUND

There is presently a need for patterning and common area deposition using techniques for area-selective atomic layer deposition (AS-ALD) based on electron beam patterning of chemical functional groups. Existing approaches for AS-ALD suffer from limited flexibility, poor spatial resolution, and low contrast between growth and non-growth target areas. These approaches are also incompatible with established semiconductor fabrication processes.

The present disclosure seeks to overcome these limitations and provides flexible control of growth area, high spatial resolution, and higher contrast between growth and non-growth regions.

SUMMARY

The present disclosure is generally directed to a method of depositing a nanoscale-thin film in a preselected area on a substrate, the method comprising depositing a layer of functionalizing molecule onto or adjacent to a first surface of the substrate; functionalizing the first surface of the substrate by focusing a source of ionizing radiation onto the layer of the functionalizing molecule; removing the layer of functionalizing molecule; and depositing a nanoscale-thin film onto the functionalized first surface of the substrate; wherein the functionalizing molecule is in a solid or gaseous state.

Also provided herein is a method of functionalizing a preselected area on a substrate, the method comprising depositing a layer of a functionalizing molecule onto or adjacent to a first surface of the substrate; focusing a source of ionizing radiation onto the layer of functionalizing molecule; and rastering the source of ionizing radiation along the layer of functionalizing molecule to create a desired pattern of functionality on the substrate; wherein the source of ionizing radiation dissociates the functionalizing molecule through radiolysis, and the reaction products of the radiolysis functionalize the substrate; and wherein the functionalizing molecule is in a solid or gaseous state.

Other objects and features will be in part apparent and in part pointed out hereinafter.

BRIEF DESCRIPTION OF THE DRAWINGS

The patent or application file contains at least one drawing executed in color. Copies of this patent or patent application publication with color drawings will be provided by the Office upon request and payment of the necessary fee.

Corresponding reference characters indicate corresponding parts throughout the drawings.

DETAILED DESCRIPTION

Figure 1:
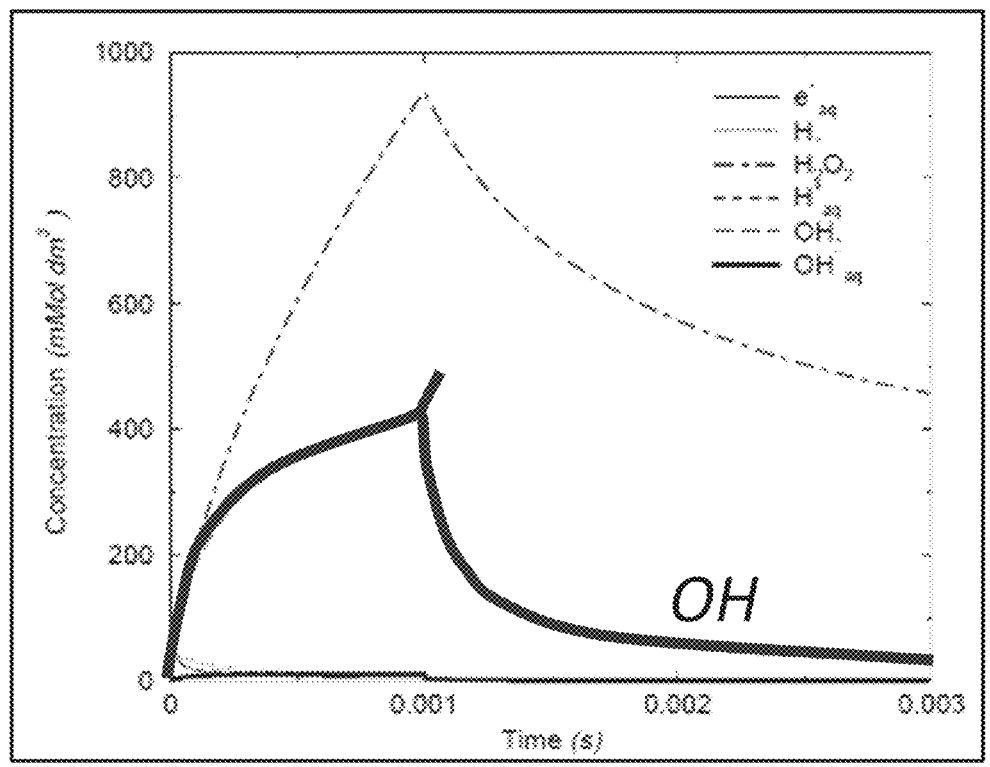
FIG. 1 is a graph of time of exposure to 5 keV vs. concentration of various chemical species, including —OH.

Described herein is method of area-selective nanoscale-thin layer deposition, such as area-selective atomic layer deposition (AS-ALD), enabled by a spatially controlled hydroxylation process. In various embodiments, the process occurs within a low-pressure water vapor environment established within an environmental scanning electron microscope (ESEM). The ESEM electron beam interacts with the water vapor in its path and generates a local region of reactive species (e.g., hydroxyl radicals) at the substrate surface where the electron beam is focused. This causes the hydroxyls to dock to the surface of the substrate, creating a dense population of sites for nucleation and growth of deposited materials. The functionalized area is determined by the path of the electron beam. After the substrate has been functionalized, deposition processes can follow.

Alternatively to a water vapor ambient environment, in the present disclosure, a thin layer of ice serves as the source for chemical functionalization or doping. Typically, when ice is utilized, it is deposited to the first surface of a substrate. The substrate can comprise any material, including 3-D materials, onto which patterned functionality is desired. Generally, an electron beam is spatially focused onto the surface containing the ice layer and dissociates the solid ice via a radiolysis process. This process generates reaction products that functionalize the surface of the substrate. The electron beam can be rastered on the surface of the ice to generate a desired pattern of functionality. Once the functionalizing process is complete, the substrate is heated (or otherwise allowed to warm from cryogenic temperatures) to cause the ice to evaporate. Alternatively, or in addition to warming, the substrate can be submerged in a wash solution to remove the condensed ice layer. The functionalized substrate can then be used for subsequent area-selective nanoscale-thin layer deposition, if desired.

Because the water concentration in solid ice is orders of magnitude greater than that present in a low-pressure water vapor ambient environment, the concentration of reactive byproducts may be greater when using solid ice as a radiolysis source, thereby allowing for more rapid functionalization. Furthermore, a water vapor ambient environment is not required to induce radiolysis in an ice layer, allowing electron beam functionalization in a high vacuum environment. By avoiding collisions with water vapor in high vacuum environments, the electron beam can be optimally focused at the substrate surface, leading to an increased spatial patterning resolution relative to functionalization in a vapor environment. In particular, the formation of a cone of radiolysis products during electron beam exposure in the gas phase is known to limit the spatial resolution for patterning to greater than 65 nanometers. With a thin layer of ice on the surface, the patterning resolution should reasonably approach the spatial resolution limits of the scanning electron microscope (SEM), which is less than 5 nm.

Thus, one aspect of the present invention is directed to the controlled deposition of a nanometer-thick ice layer for use with high-precision lithography. The ice layer can function as a thin resist layer that is etched by an electron beam to facilitate patterning during subsequent deposition of functional layers (e.g., metallic contacts). As explained in more detail below, the ice layer can comprise water ice, organic molecule ice, or ice composed of other inorganic, metal organic, or mixtures of molecules.

Accordingly, provided herein is a method of depositing a nanoscale-thin film in a preselected area (in some cases, an atomic layer) onto a substrate. The method generally comprises depositing a layer of a functionalizing molecule onto or adjacent to a first surface of the substrate. The surface of the substrate onto which the layer is deposited is generally an exposed top surface of the substrate. Typically, the functionalizing molecule is in a solid or gaseous state. Once the layer of functionalizing molecule has been deposited, the first surface of the substrate is functionalized by focusing a source of ionizing radiation onto the layer of functionalizing molecule. Once the functionalization step is complete, the layer of functionalizing molecule is removed and a nanoscale-thin film is deposited onto the functionalized first surface of the substrate.

The functionalizing molecule can generally be any compound that allows for functionalization of the first surface of the substrate when exposed to a source of ionizing radiation. In various embodiments, the functionalizing molecule is a compound containing at least one heteroatom, and preferably at least one oxygen, nitrogen, sulfur, phosphorous, and/or boron atom and is either organic or inorganic. As non-limiting examples, an inorganic functionalizing molecule can be selected from the group consisting of $SF_6$, $H_2S$, $N_2$, $NH_3$, $O_2$, $H_2O$, $PH_3$, $PCl_3$, $B_2H_6$, $BCl_3$, or combinations thereof, and the like. Non-limiting examples of organic functionalizing molecules include thiophene, pyrrole, furan, and other aromatic or aliphatic heteroatom-containing hydrocarbons. These hydrocarbons can be cyclic or acyclic. In preferred embodiments, the functionalizing molecule comprises $H_2O$.

As referred to herein, the term "functionalization" and derivatives thereof broadly refers to the addition of a functional group to the substrate. For example, the functional group may comprise an —OH (hydroxy) group. In other embodiments, the functional group can comprise an amino, thiol, phosphino, amido, nitro, halo, silyl, carboxyl, hemiacetal, hemiketal, imino, oxime, sulfonic acid, or borono group. Where applicable, these functional groups can be optionally substituted. The level of functionalization can be quantified using Raman spectroscopy (RS) to map the presence of functional groups on the substrate before and after exposure to the source of ionizing energy.

In general, the functionalizing molecule is in a solid or gaseous state. For example, the functionalizing molecule may comprise water and may be in the form of water ice or water vapor. However, it will be understood that the functionalizing molecule can be any molecule as described herein in either a solid (ice) state or a gaseous (vapor) state. In order to form a solid state layer of functionalizing molecule, a vapor of molecules is introduced into the gas phase under vacuum, and the substrate is held at a temperature below the freezing point of the delivered molecule to produce a thin layer of ice. In other aspects, the layer of thin vitreous ice may be created by flash freezing via quenching the substrate in liquid nitrogen.

The substrate can comprise any substrate appropriate for nanoscale-thin layer deposition purposes (i.e., any substrate that can be functionalized with the chosen functionalizing molecule in a way that allows for deposition of an atomic or nanoscale-thin layer). In various aspects, the substrate should not contain a heteroatom contained within the functionalizing molecule, or the functionalizing molecule should not contain a heteroatom contained within the substrate. For example, functionalizing molecules containing heteroatoms other than sulfur are preferred for substrates comprising $MoS_2$. Furthermore, a functionalizing molecule containing a particular heteroatom may impact certain electronic properties of the substrate. As a particular example, introducing at least one of N, S, O, B, and/or P heteroatoms to graphene/graphite can be used to control the electronic bandgap and p-type vs. n-type character of the substrate. Typically, the substrate comprises a 2-D material appropriate for use in nanoelectronics, but in some instances, may comprise a 3-D material. For example, the substrate can comprise a graphene (or graphite) substrate. In other embodiments, the substrate can comprise $MoS_2$. Preferably, the substrate comprises graphene due to its single, two-dimensional layer consisting of hexagonal graphite lattice, which provides improved mechanical, optical, and electrical properties and is prevalent in nanoelectronics.

In various embodiments, the source of ionizing radiation can comprise electromagnetic radiation, for example, ultraviolet or extreme ultraviolet radiation. Ultraviolet and extreme ultraviolet radiation are provided to the substrate by a laser, lamp, or other electromagnetic radiation source. In various aspects, the electromagnetic radiation source can be rastered, for example using a laser, and may be used in combination with a contact or non-contact mask to define the exposure areas. In addition, the source of ionizing radiation can comprise an electron beam or electrons derived from a plasma or other constituent components of a plasma including, for example, charged ions. The charged plasma constituents are directed onto the substrate using an electric field. The plasma can be used in combination with a contact or non-contact mask to define the exposure area on the substrate. In some instances, the electron beam comprises a scanning electron microscope. More particularly, the scanning electron microscope can comprise an environmental scanning electron microscope. In various embodiments, the source of ionizing radiation (e.g., electron beam) can be rastered along the layer of functionalizing molecule to create a desired pattern of functionality. For example, the pattern can be lines, strips, grids, array, or more complex 2-D or topographical pattern. The skilled person will understand, however, that the particular pattern may be highly variable and dependent on the particular application. In applications where atomic layer deposition (or nanoscale-thin film deposition) occurs after the functionalizing step, the deposition generally occurs only at the functionalized sites of the substrate (e.g., along the pattern of functionality created by rastering the source of ionizing radiation).

As will be understood by the skilled person, the occurrence and level of functionalization that occurs depends upon the level of energy provided by the source of ionizing radiation. Generally, the level of energy must be appropriate to decompose or activate the functionalizing molecule, and may depend on the source of ionizing energy itself. For example, the level of energy provided by an electron beam is typically at least about 5 keV, for example, from 5 keV to 200 keV or from keV to 100 keV in order to achieve an appropriate level of functionalization of the substrate. As will be understood by the skilled person, the choice of energy level of radiation is selected based on the dissociation energy of the functionalizing molecule. The energy derived from the ionizing radiation must be sufficient to activate or dissociate the functionalizing molecule and provide enough excess energy to break surface bonds on the substrate and introduce new functional groups. The energy level can be altered by manipulating several factors including voltage, dwell time, and gas pressure (when a gaseous functionalizing molecule is used). FIG. 1 illustrates the varying —OH concentration based on time when water is used as the functionalizing molecule.

Figure 2:
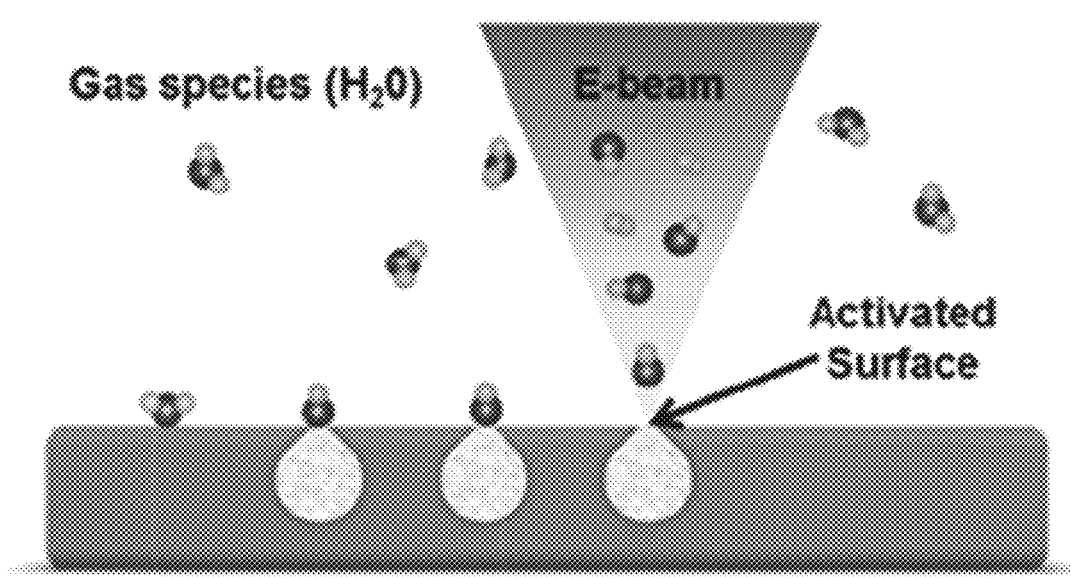
FIG. 2 is a visual representation of exposure of a substrate to an electron beam in the presence of water vapor.

In general, the source of ionizing energy dissociates the functionalizing molecule through radiolysis. That is, a functional radical is cleaved from the functionalizing molecule through radiolysis during exposure to ionizing radiation. This functional radical then attaches itself to the first surface of the substrate and thereby functionalizes the substrate. As a particular example, and as illustrated in FIG. 2, when the functionalizing molecule comprises water, a hydroxyl group may be cleaved from the water molecule during the radiolysis process after exposure to the ionizing radiation. The hydroxyl group then bonds to the first surface of the substrate. As discussed in more detail below, it is with these functional groups that the atomic layer deposition or nanoscale-thin film precursors react in order to deposit the desired material onto the surface of the substrate. Thus, the deposition is limited to the sites of the functional groups generated during the functionalization process.

Once the functionalization process is complete, the layer of functionalizing molecule is removed from the substrate, leaving the functionalized substrate itself. The removal process depends, in part, on the type of functionalizing molecule and its state. The appropriate removal process will be readily understood by the skilled person. For example, when the functionalizing molecule is water in a solid state (i.e., ice), the removal process can comprise warming the substrate above the melting point of ice (i.e., above about 0° C.). It will be understood that the warming process can be active (i.e., actively heating the substrate above 0° C. with an external heating source) or passive (i.e., allowing the substrate to warm to ambient temperature). Alternatively, the layer of ice can be removed by submerging the substrate in a wash solution. The wash solution can comprise any wash solution known in the art, for example, a single or blend of different alcohols or other polar solvents, which may be either protic or aprotic. Specific examples of solvents that may be included in the wash solution comprise methanol, ethanol, 2-propanol, t-butanol, acetone, acetonitrile, ethyl acetate, and/or tetrahydrofuran. In other embodiments, the removal process can comprise a combination of warming the substrate and submerging the substrate in a wash solution. When the functionalizing molecule is a solid other than water ice, the removal process can comprise warming the substrate actively or passively above the melting point of the particular functionalizing molecule. Alternatively, or in addition to the warming process, the removal process can comprise submerging the substrate in a wash solution. The wash solution may vary based on the type of functionalizing molecule to be removed. For example, when the functionalizing molecule is organic, the wash solution can comprise a hydrocarbon or other non-polar solvent, or a blend thereof, for example, pentane, hexane, cyclohexane, benzene, and/or toluene, and when the functionalizing molecule is inorganic, the wash solution can comprise an acid, base, or other etchant solution selected to preferentially remove the unreacted inorganic substituents while leaving the reacted inorganic constituents.

As mentioned, the removal process will vary when the functionalizing molecule is in a gaseous state. Generally, independent of the particular identity of the functionalizing molecule, when the functionalizing molecule is in a gaseous state, the removal process comprises allowing the gas to dissipate. For example, when the functionalizing molecule is water in a gaseous state (i.e., water vapor), the removal process comprises allowing the water vapor to dissipate. The period of time and ambient environment (e.g., pressure, temperature, gas-phase compositions, and the like) required for complete dissipation of various functionalizing molecules will be readily understood by the skilled person. For example, when ice is used, increased temperature and time and decreased pressure will result in increased ice sublimation.

Figure 3A:
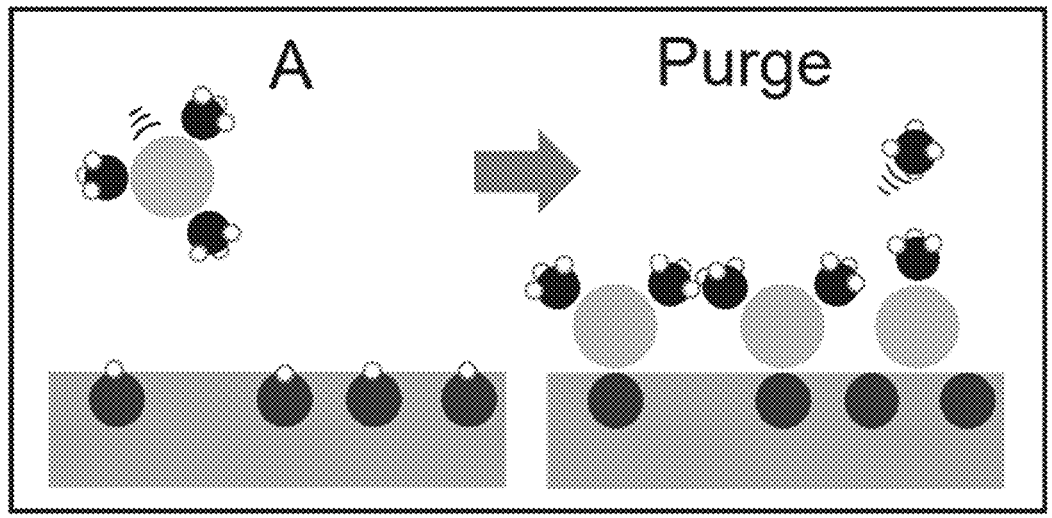
FIG. 3a is an illustration of the first step of an ALD process through which trimethylaluminum is introduced to an OH-functionalized substrate and then purged.
Figure 3B:
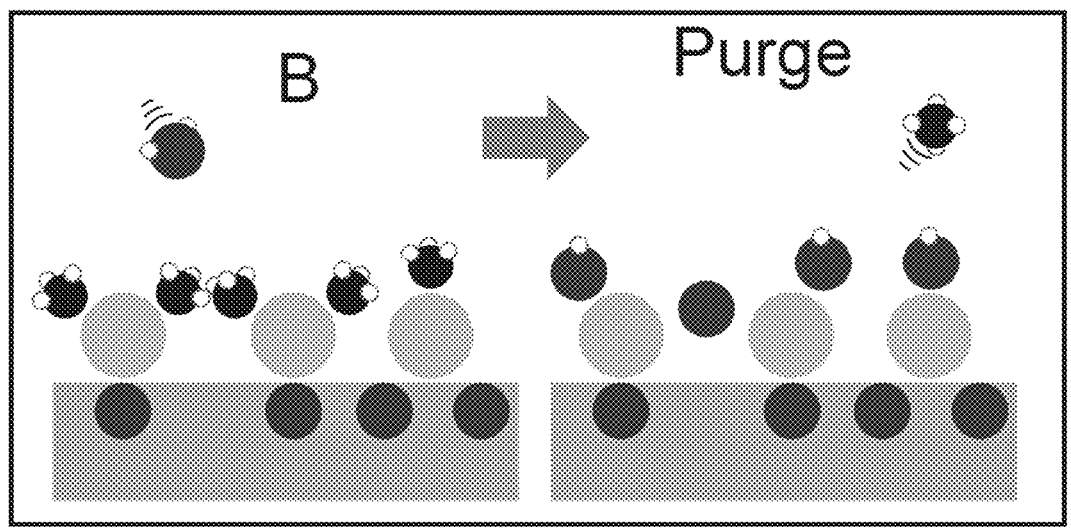
FIG. 3b is an illustration of the second step of an ALD process through which water is introduced and then purged.

Once the removal process is complete, the method further comprises depositing a nanoscale-thin film onto the functionalized first surface of the substrate. As used herein, nanoscale means having at least one dimension that is from about 1 to about 100 nm. In preferred embodiments, the nanoscale-thin film comprises an atomic layer. For example, the depositing step can comprise atomic layer deposition (ALD). Because the substrate is pre-patterned using the above-described methods, an area-selective atomic layer deposition (AS-ALD) may be achieved. The general process of ALD or other nanoscale-thin film deposition is readily understood by the skilled person and generally utilizes sequential, alternating pulses of gaseous chemical precursors that react with the substrate to deposit a film of a desired compound. The ALD process is visually represented in FIGS. 3a and 3b. In FIG. 3a, trimethylaluminum (TMA, a precursor to aluminum oxide) is introduced to the substrate and bonds to the OH-terminated substrate, followed by a purge of any excess TMA. FIG. 3b illustrates the following step of introducing water to the system and purging the system again. Suitable methods for ALD include those disclosed in George, S M. Atomic layer deposition: an overview. Chem Rev. 2010 January; 110(1):111-31. doi: 10.1021/cr900056b and Miikkulainen, V., et al. Crystallinity of inorganic films grown by atomic layer deposition: Overview and general trends. Journal of Applied Physics 113, 021301 (2013). doi:10.1063/1.4757907.

Figure 4A:
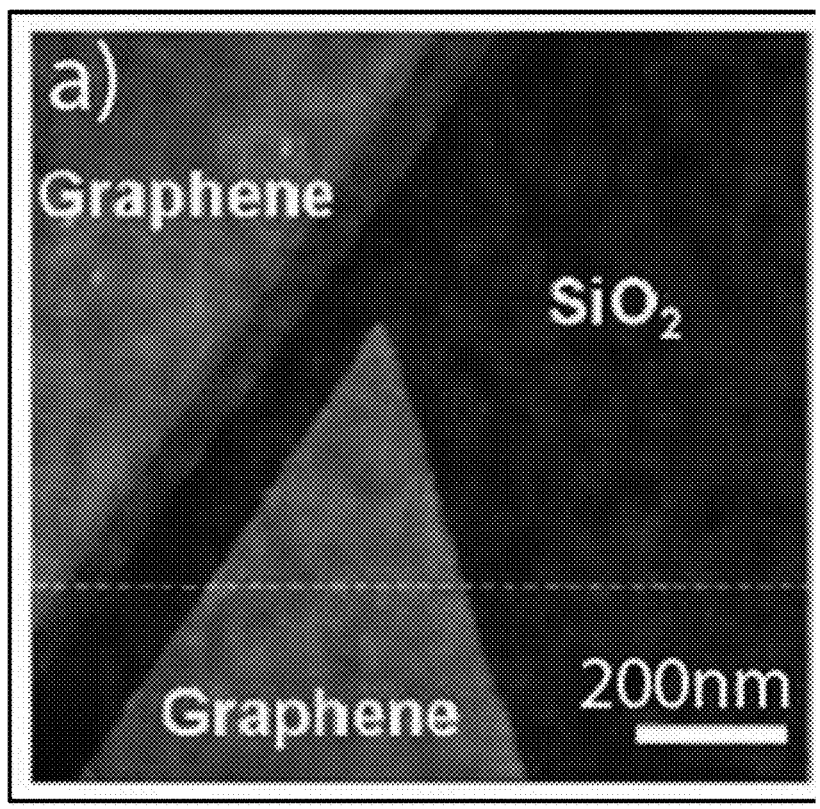
FIG. 4a is an image of graphene before the ALD process.
Figure 4B:
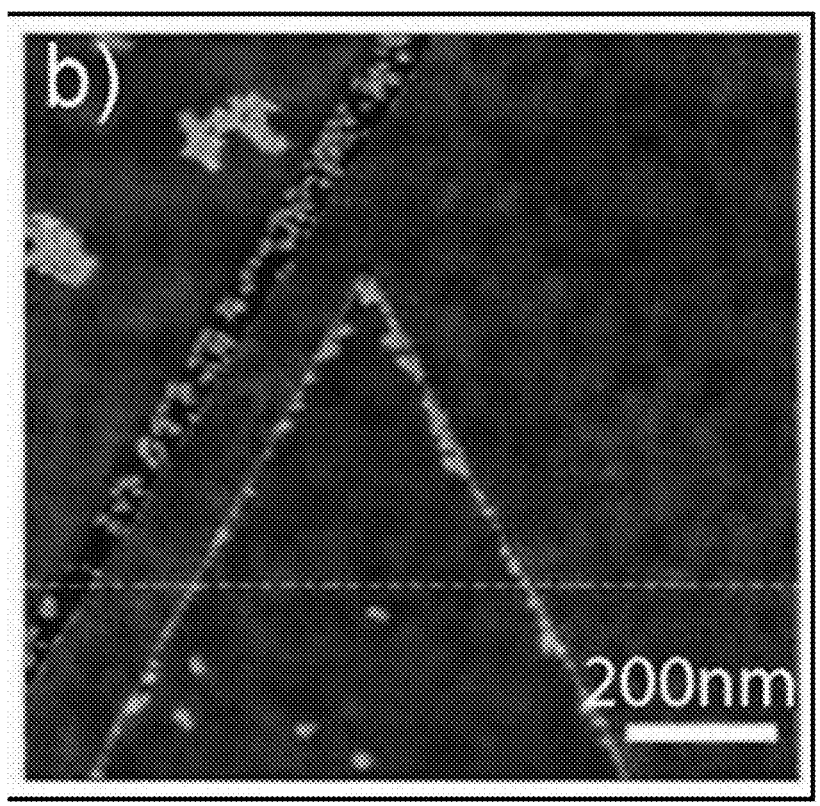
FIG. 4b is an image of graphene after the nucleation process showing the deposition of aluminum.

The ALD process is typically incompatible with graphene substrates due to its low surface energy and lack of reactive sites (see FIG. 4 depicted graphene before and after the ALD process, demonstrating that most of the alumina nucleation is near boundary defects in the graphene itself). However, it has been discovered that when graphene is functionalized as described above, the functionalized sites provide ample opportunity for use with ALD and other nanoscale-thin film deposition techniques.

The deposited nanoscale-thin film generally comprises a metal oxide, for example, aluminum oxide, zirconium dioxide, zinc oxide, and hafnium (IV) oxide, or a combination of metal oxides. The nanoscale-thin film can also comprise a metal nitride (for example, titanium nitride and tantalum nitride), metal fluoride, metal sulfide, metal selenide, or a combination thereof. The skilled person will understand that various other compounds are appropriate for nanoscale-thin and atomic layer deposition and can be used in the present methods. In particular, the present disclosure seeks to functionalize the substrate in a way to lead to resist-free and high-density ALD patterning with spatial resolution on the order of SEM imaging resolution (less than 10 nm) without damaging the underlying graphene lattice.

Substrate characterization before and after the nanoscale-thin film is deposited can be conducted using atomic force microscopy (AFM) and/or energy dispersive spectroscopy (EDS). AFM imaging provides morphological data to quantify the spatial resolution and nucleation density of the proposed deposition approach, while EDS provides information regarding the relative deposition inside and outside the target (i.e., functionalized) regions.

Also provided herein is a method of functionalizing a preselected area on a substrate, the method comprising depositing a layer of functionalizing molecule onto or adjacent to a first surface of the substrate, focusing a source of ionizing radiation onto the layer of functionalizing molecule, and rastering the source of ionizing radiation along the layer of functionalizing molecule to create a desired pattern of functionality on the substrate, wherein the electron beam dissociates the functionalizing molecule through radiolysis, and the reaction products of the radiolysis functionalize the substrate, and wherein the functionalizing molecule is in a solid or gaseous state.

It will be understood that features discussed above with particular reference to the method of depositing a nanoscale-thin film also apply equally to the method of functionalizing a substrate.

In the method described above, the rastering step is optionally followed by removing the layer of functionalizing molecule from the substrate, the specific details of which are described above. Following the removal of the functionalizing molecule, the method can further comprise depositing an atomic layer (or a nanoscale-thin film) onto the surface of the substrate, as described above.

Having described the invention in detail, it will be apparent that modifications and variations are possible without departing from the scope of the invention defined in the appended claims.

EXAMPLES

The following non-limiting examples are provided to further illustrate the present invention.

Example 1: Aluminum Oxide Deposition on Exfoliated Graphene

Figure 5A:
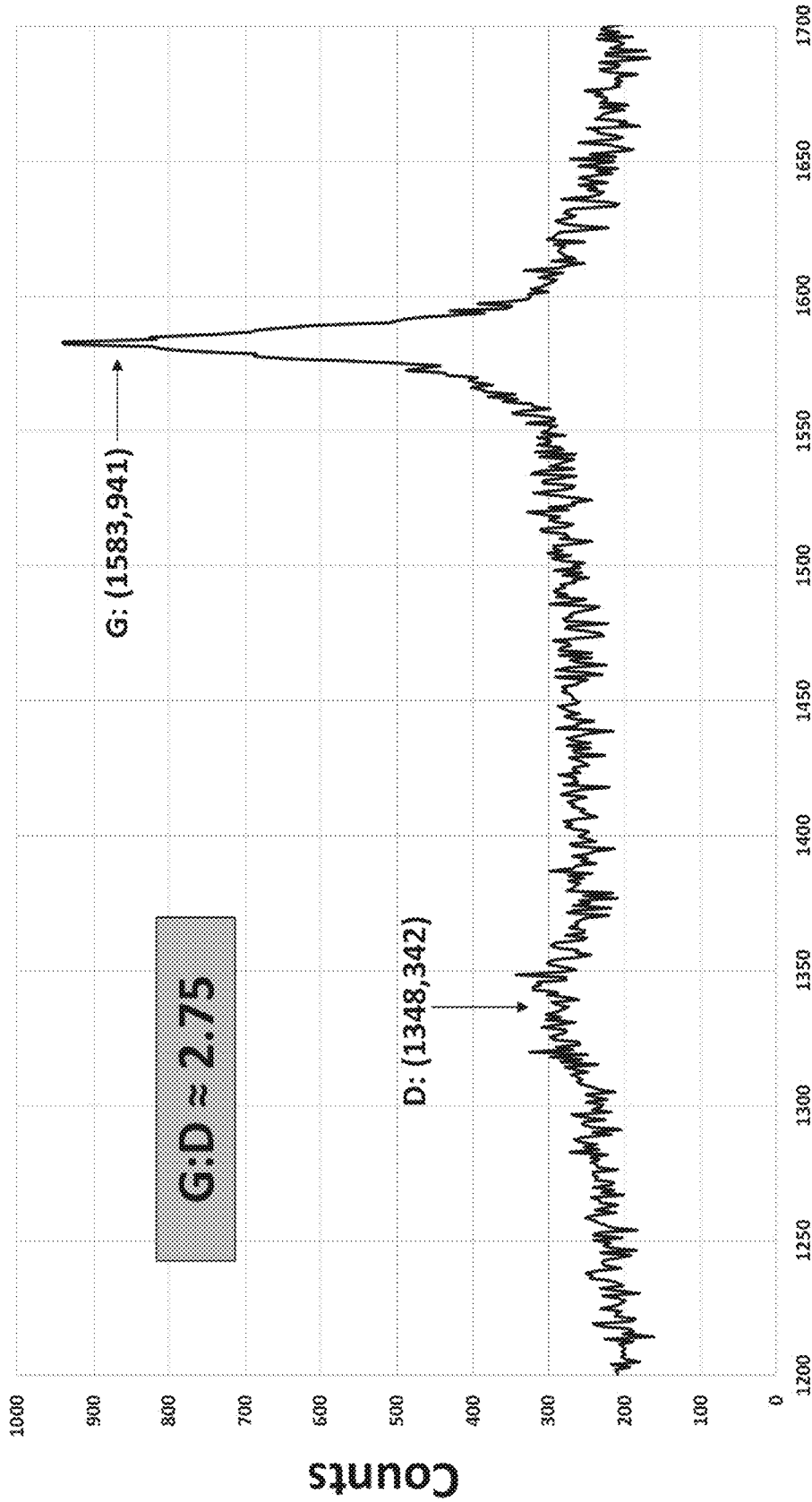
FIG. 5a is a Raman spectrum of the exfoliated graphene of Example 1 before functionalization.
Figure 5B:
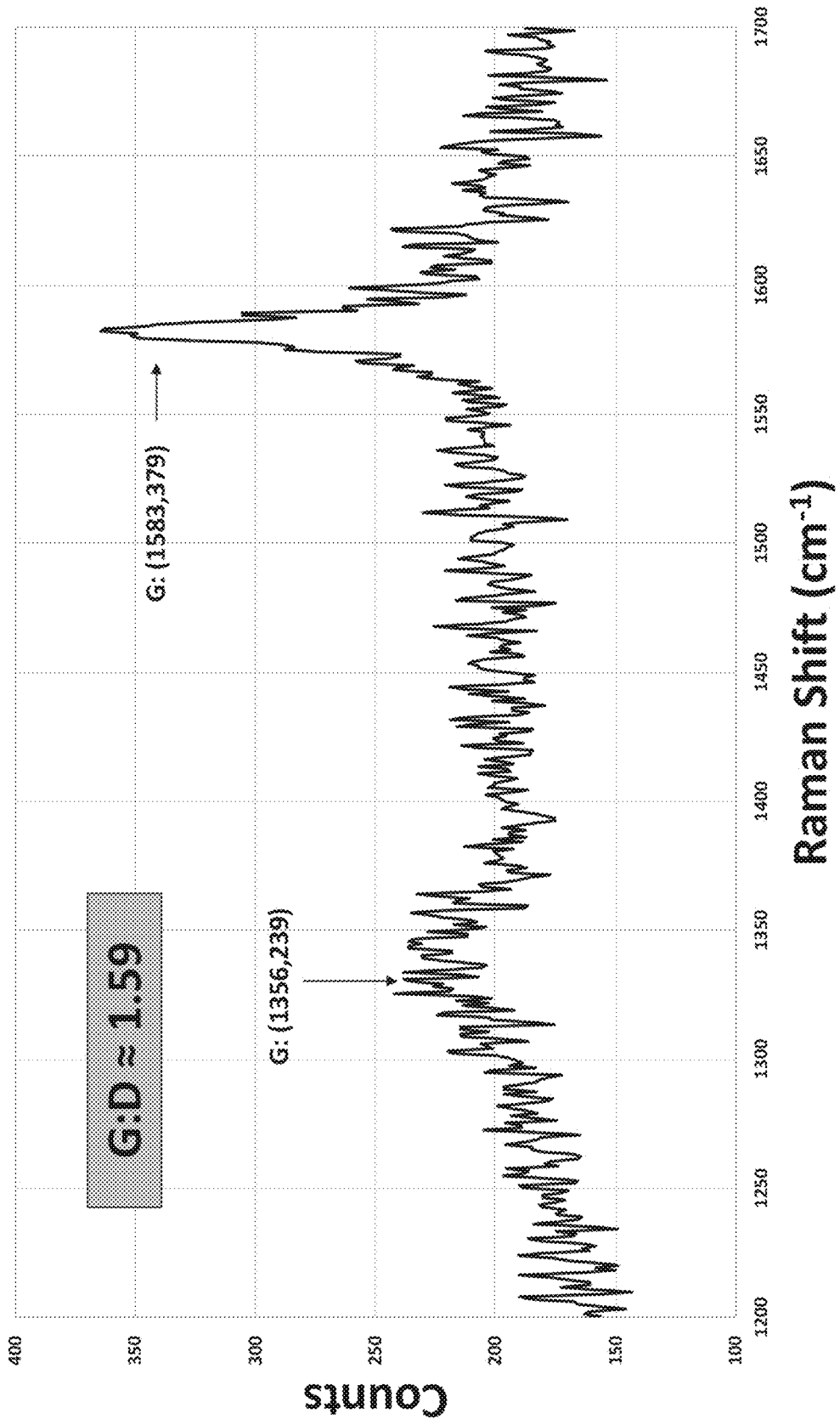
FIG. 5b is a Raman spectrum of the exfoliated graphene of Example 1 after functionalization.

An exfoliated graphene substrate was exposed to electron beam functional group patterning with low accelerating voltage and a slow dwell time in a water vapor ambient environment, thereby producing hydroxyl radical functionality on the exfoliated graphene substrate. FIGS. 5a and 5b depict the Raman spectra of non-functionalized graphene and functionalized graphene, respectively. These spectra evaluate the effect of the electron beam chemistry on the graphene structure. As seen in these spectra, there is a slight decrease in G:D ratio after functionalization (1.59 vs. 2.75), indicating a change in the graphene structure.

Figure 6:
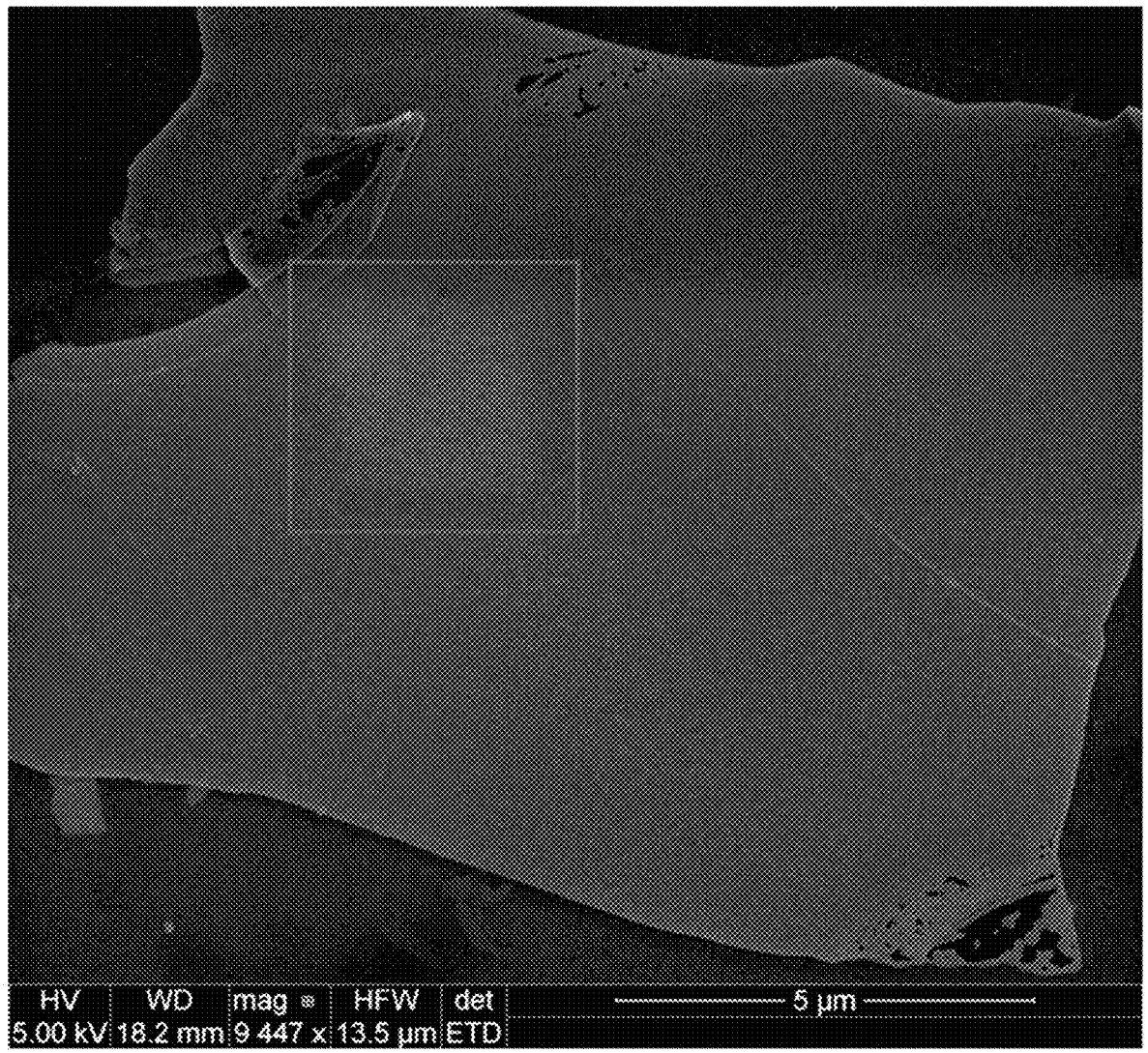
FIG. 6 is an image of the exfoliated graphene of Example 1 after deposition of aluminum oxide.
Figure 7:
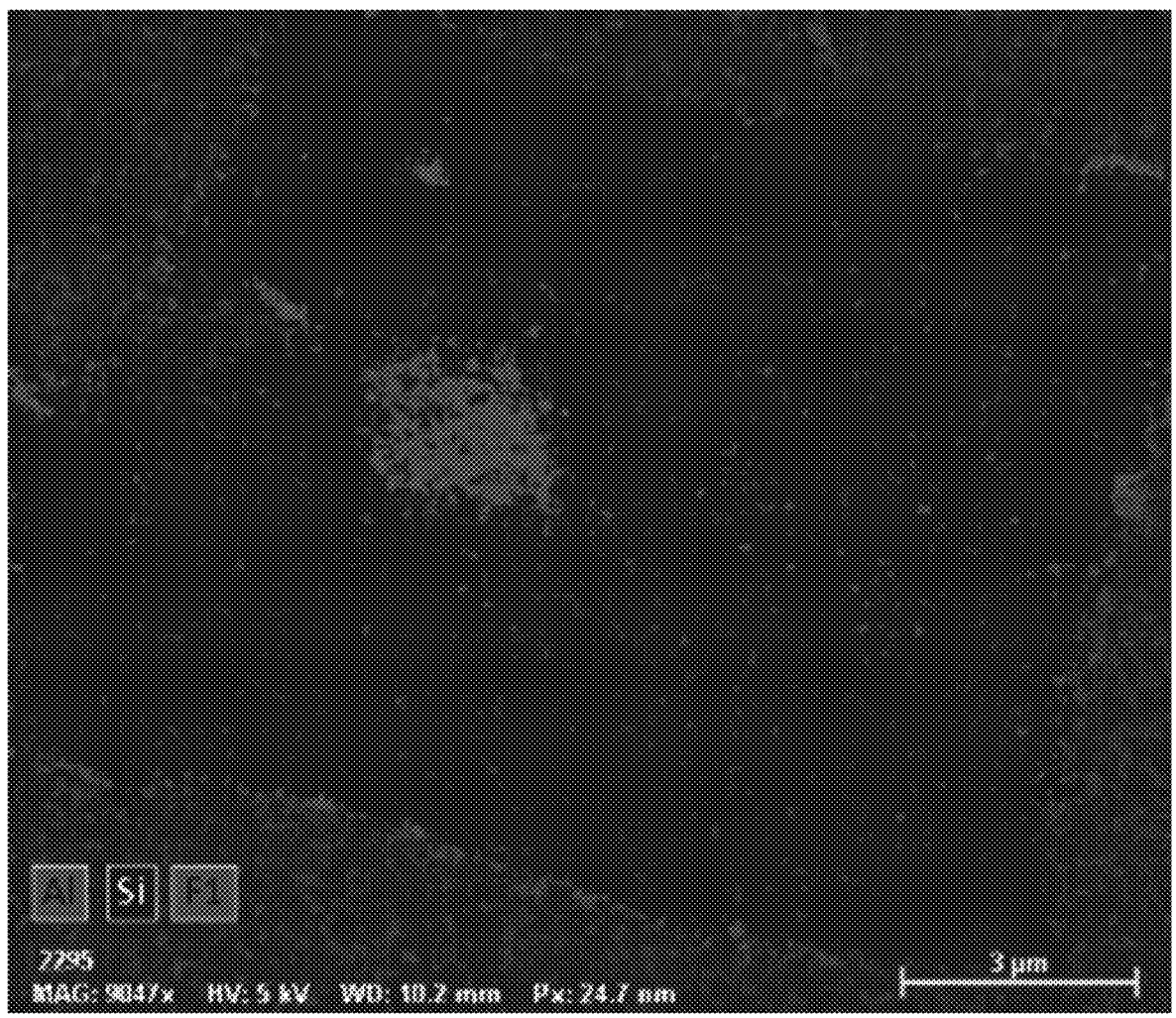
FIG. 7 is an energy dispersive spectroscopy (EDS) map of aluminum deposition on exfoliated graphene produced in Example 1.
Figure 8:
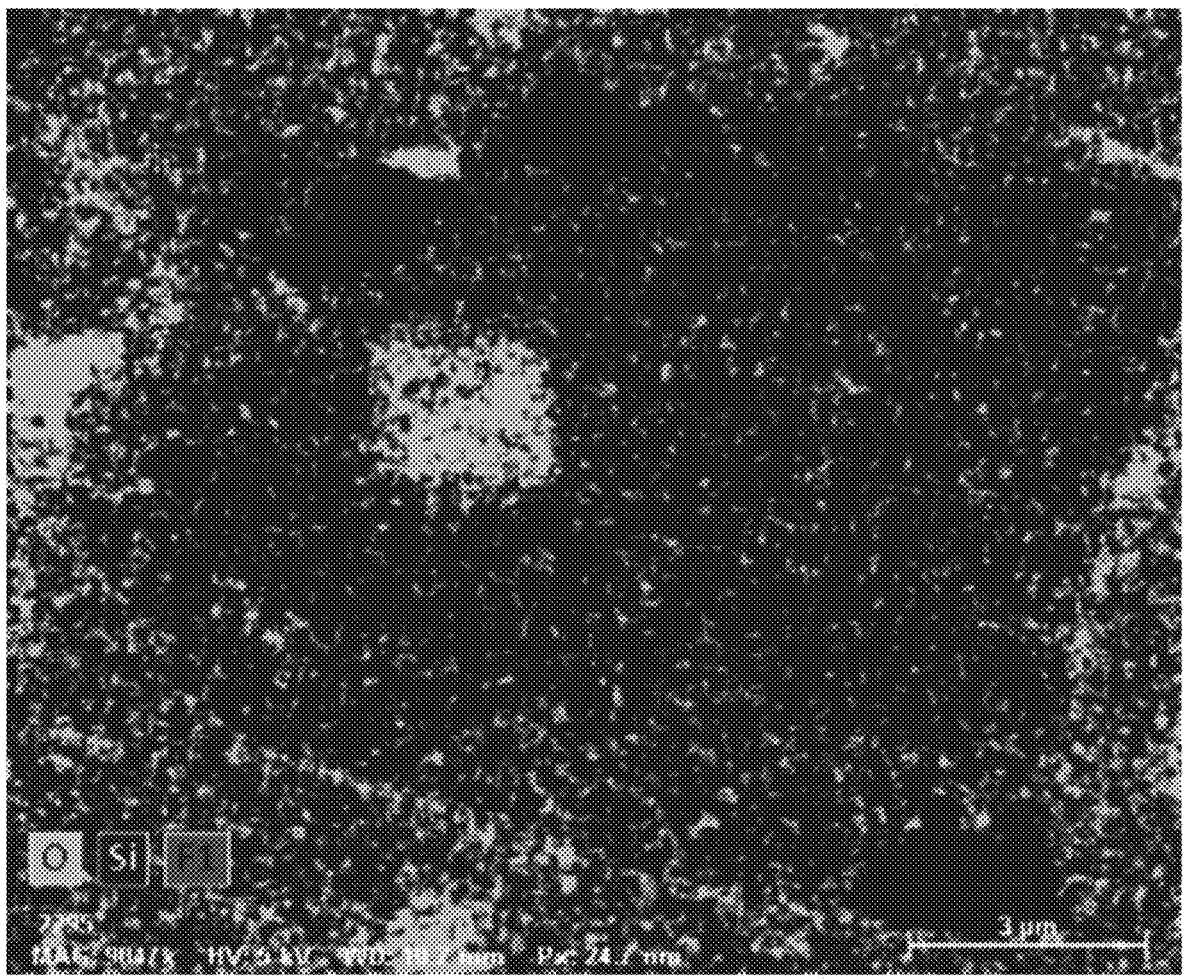
FIG. 8 is an EDS map of oxygen concentration on exfoliated graphene produced in Example 1.

Once the water vapor was allowed to dissipate, the process was followed by aluminum oxide ALD. The exfoliated graphene with a deposited layer of aluminum oxide in in the preselected area is depicted in FIG. 6. The aluminum oxide deposition was characterized using energy dispersive spectroscopy (EDS) spectroscopy (FIGS. 7 and 8). In this example, the $sp^2$ carbon in the exfoliated graphene is non-reactive to the ALD precursors. The electron beam patterning introduces reactive hydroxyl groups onto the surface of the graphene, thereby enabling ALD growth in the patterned area. As depicted in FIG. 7 demonstrating aluminum concentration and FIG. 8 demonstrating oxygen concentration, the ALD deposition is highly localized within the 500 nm×500 nm functionalized area (as well as the edges of the graphene), where the hydroxyls are introduced.

Example 2: Aluminum Oxide Deposition on $MoS_2$

Figure 9:
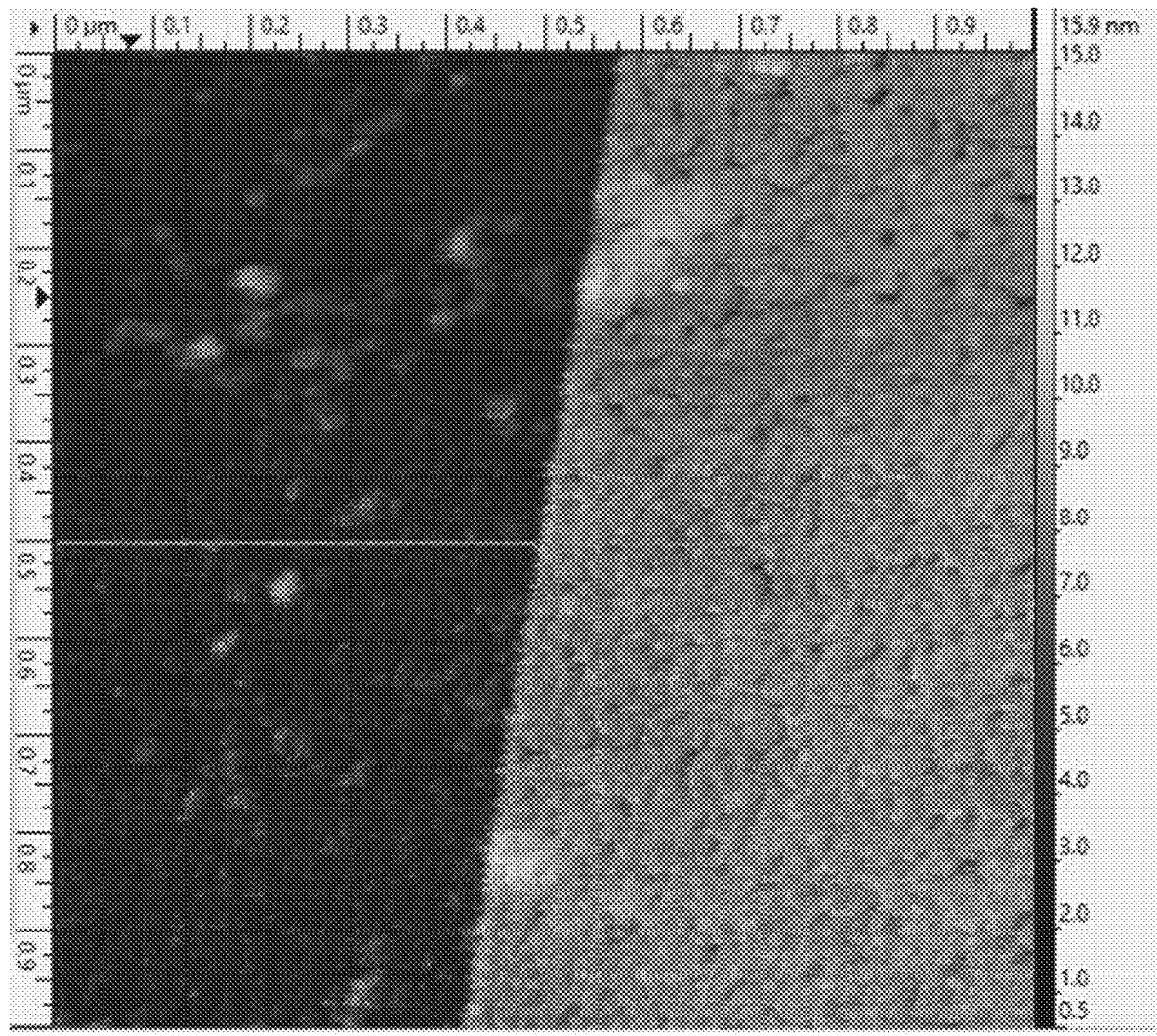
FIG. 9 is an image of the $MoS_2$ substrate of Example 2 after deposition of aluminum oxide.

A molybdenum disulfide ($MoS_2$) substrate was exposed to electron beam (2 kV with 300 μs exposure time) functional group patterning in a 10 Pa water vapor ambient environment. Once the water vapor was allowed to dissipate, the process was followed by aluminum oxide ALD, the results of which are shown in FIG. 9. As can be seen in FIG. 9, although the process resulted in general coverage with aluminum oxide, several voids were observed, producing an RMS roughness of 1.02 nm.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above methods without departing from the scope of the invention, it is intended that all matter contained in the above description and shown in the accompanying drawings shall be interpreted as illustrative and not in a limiting sense.

The invention claimed is:

1. A method of depositing a nanoscale-thin film in a preselected area on a substrate, the method comprising:
    depositing a layer of a functionalizing molecule onto or adjacent to a first surface of the substrate;
    functionalizing the first surface of the substrate by focusing a source of ionizing radiation onto the layer of the functionalizing molecule to create a desired pattern of functionality with nano-scale spatial resolution on the substrate;
    removing the layer of the functionalizing molecule; and
    depositing a nanoscale-thin film onto the functionalized first surface of the substrate to form a deposited nanoscale-thin film.

2. The method of claim 1, wherein the functionalizing molecule is in a solid state.

3. The method of claim 1, wherein the source of ionizing radiation comprises an electron beam.

4. The method of claim 1, wherein the substrate comprises a graphene substrate.

5. The method of claim 1, wherein the desired pattern of functionality on the substrate comprises hydroxyl radical functionality.

6. The method of claim 1, wherein the substrate comprises $MoS_2$.

7. The method of claim 1, wherein the source of ionizing radiation comprises electromagnetic radiation.

8. The method of claim 1, wherein depositing the nanoscale-thin film is performed using atomic layer deposition to selectively deposit a desired compound on the desired pattern of functionality with nano-scale spatial resolution.

9. The method of claim 1, wherein the substrate is functionalized by adding a functional group comprising amino, amido, nitro, imino, or oxime.

10. The method of claim 1, wherein the substrate is functionalized by adding a functional group comprising thiol or sulfonic acid.

11. The method of claim 1, wherein the substrate is functionalized by adding a functional group comprising halo.

12. The method of claim 1, wherein the substrate is functionalized by adding a functional group comprising hemiacetal or hemiketal.

13. The method of claim 1, wherein the substrate is functionalized by adding a functional group comprising a phosphino group.

14. The method of claim 1, wherein the substrate is functionalized by adding a functional group comprising oxime.

15. The method of claim 1, wherein the substrate is functionalized by adding a functional group comprising a borono group.

16. The method of claim 1, wherein the substrate is functionalized by adding a functional group comprising a carboxyl group.

17. The method of claim 1, wherein the deposited nanoscale-thin film comprises a metal oxide, metal nitride, metal fluoride, metal sulfide, metal selenide, or a combination thereof.

18. The method of claim 17, wherein the deposited nanoscale-thin film comprises a metal oxide and the metal oxide is aluminum oxide, zirconium dioxide, zinc oxide, hafnium (IV) oxide, or a combination thereof.

19. The method of claim 1, wherein the deposited nanoscale-thin film comprises a metal nitride and the metal nitride is titanium nitride, tantalum nitride, or a combination thereof.

* * * * *